(12) United States Patent
Lee et al.

(10) Patent No.: US 6,531,235 B2
(45) Date of Patent: Mar. 11, 2003

(54) NON-C-AXIS ORIENTED BISMUTH-LAYERED PEROVSKITE FERROELECTRIC STRUCTURE EPITAXIALLY GROWN ON BUFFERED SILICON

(75) Inventors: Ho Nyung Lee, Halle (DE); Stephan Senz, Halle (DE); Alina Visinoiu, Halle (DE); Alain Pignolet, Halle (DE); Dietrich Hesse, Halle (DE); Ulrich Gösele, Halle (DE)

(73) Assignee: Max-Planck-Institute für Mikrostrukturphysik, Halle (DE)

( * ) Notice: Subject to any disclaimer, the term of this patent is extended or adjusted under 35 U.S.C. 154(b) by 0 days.

(21) Appl. No.: 09/875,630

(22) Filed: Jun. 6, 2001

(65) Prior Publication Data

US 2002/0197489 A1 Dec. 26, 2002

(51) Int. Cl.[7] .................................................. B32B 9/00
(52) U.S. Cl. ....................... 428/702; 428/699; 428/700; 428/701
(58) Field of Search ................. 428/446, 689, 428/697, 699, 700, 701, 702

(56) References Cited

U.S. PATENT DOCUMENTS

| 5,270,298 A | 12/1993 | Ramesh | |
|---|---|---|---|
| 6,151,240 A | * 11/2000 | Suzuki | 257/295 |

OTHER PUBLICATIONS

A–Paz de Araujo et al., "Fatigue–free ferroelectric capacitors with platinum electrodes," Nature (England), vol. 374, p. 627–629, (Apr. 13, 1995).

Park et al., "Lanthanum–substituted bismuth titanate for use in non–volatile memories," Nature, Macmillan Magazines Ltd. (England), vol. 401, p. 682–684, (Oct. 14, 1999).

Kingon, A., "Memories are made of . . . ," Nature, Macmillan Magazines Ltd. (England), vol. 401, p. 658–659, (Oct. 14, 1999).

Lee et al., "Structure and Morphology of Epitaxially Intergrown (100)– and (116)–Oriented SrBi2Ta2O9 Ferroelectric Thin Films on SrLaGaO4(110) Substrates," Mat. Res. Soc. Symp. Proc., Materials Research Society (USA), vol. 688, p. C8.5.1–C8.5.6, (2002), No month.

Lee et al., "Epitaxial growth of ferroelectric SrBi2Ta2O9 thin films of mixed (100) and (116) orientation on SrLaGaO4(110)," Applied Physics Letters, American Institute of Physics (USA), vol. 79 (No. 18), p. 2961–2963, (Oct. 29, 2001).

Theis et al., "Adsorption–controlled growth of Bi4Ti3O12 by reactive MBE," Applied Physics Letters, American Institute of Physics (USA), vol. 72 (No. 22), p. 2817–2819, (Jun. 1, 1998).

Rae et al., "Structure Refinement of Commensurately Modulated Bismuth Titanate, Bi4Ti3O12," Acta Cryst., International Union of Crystallography (England), vol. B46, p. 474–486, (1990), No month.

Cummins et al., "Electrical and Optical Properties of Ferroelectric Bi4Ti3O12 Single Crystals," Journal of Applied Physics (USA), vol. 39, (No. 5), p. 2268–2274, (Apr. 1968).

(List continued on next page.)

*Primary Examiner*—Deborah Jones
*Assistant Examiner*—Arden Sperty
(74) *Attorney, Agent, or Firm*—Jenkins & Wilson, P.A.

(57) ABSTRACT

A structure containing a ferroelectric material comprises a substrate comprising silicon, a buffer layer formed on the substrate, and a non-c-axis-oriented, electrically-conductive template layer formed on the buffer layer. The template layer comprises a perovskite oxide compound. A non-c-axis-oriented, anisotropic perovskite ferroelectric layer is formed on the template layer.

66 Claims, 9 Drawing Sheets

OTHER PUBLICATIONS

Watanabe et al., "Preparation and Characterization of a– and b–axes–oriented epitaxially grown Bi4Ti3O12–based thin films with long–range lattice matching," MRS Fall 2001, p. 53, (Nov. 27, 2001).

Lettieri et al., "Optimization of the growth of epitaxial SrBi2Ta2O9 thin films by pulsed laser deposition," Thin Solid Films, Elsevier Science B.V. (Netherlands), vol. 379, p. 64–71, (2000).

Shimakawa et al., "Crystal and electronic structures of Bi4–xLaxTi3O12 ferroelectric materials," Applied Physics Letters, American Institute of Physics (USA), vol. 79 (No. 17), p. 2791–2793, (Oct. 22, 2001).

Lee et al., "Anisotropic ferroelectric properties of epitaxially twinned Bi3.25La0.75Ti3O12 thin films grown with three different orientations," Applied Physics Letters, American Institute of Physics (USA), vol. 80 (No. 6), p. 1040–1042, (Feb. 11, 2002).

Gruverman et al., "Nanoscopic switching behavior of epitaxial SrBi2Ta2O9 films deposited by pulsed laser deposition," Applied Physics Letters, American Institute of Physics (USA), vol. 76 (No. 1), p. 106–108, (Jan. 3, 2000).

Lee et al., "Epitaxial growth of (103)–oriented ferroelectric SrBi2Ta2O9 thin films on Si(100)," Applied Physics Letters, American Institute of Physics (Germany), vol. 78 (No. 19), p. 2922–2924, (May 7, 2001).

Lee et al., "Structural and electrical anisotropy of (001)–, (116)–, and (103)–oriented epitaxial SrBi2Ta2O9 thin films on SrTiO3 substrates grown by pulsed laser deposition," Journal of Applied Physics, American Institute of Physics (Germany), vol. 88 (No. 11), p. 6658–6664, (Dec. 1, 2000).

Lee et al., "Growth and characterization of non–c–oriented epitaxial ferroelectric SrBi2Ta2O9 films on buffered Si(100)," Physics Letters, American Institute of Physics (Germany), vol. 77 (No. 20), p. 3260–3262, (Nov. 13, 2000).

Lee et al., "Epitaxial growth of non–c–oriented ferroelectric SrBi2Ta2O9 thin films on Si(100) substrates," Applied Physics, Applied Physics A (Materials Science & Processing) (Germany), p. 101–104, (Jun. 7, 2000).

Ishikawa et al., "Crystal structure and electrical properties of epitaxial SrBi2Ta2O9 films," Journal of Applied Physics, American Institute of Physics (Japan), vol. 87 (No. 11), p. 8018–8023, (Jun. 1, 2000).

Lettieri et al., "Epitaxial growth of non–c–oriented SrBi2Nb2O9 on (111) SrTiO3," Applied Physics Letters, American Institute of Physics (USA), vol. 76 (No. 20), p. 2937–2939, (May 15, 2000).

J. Scott, "Nano–Scale Ferroelectrics for Gbit Memory Application," ISIF 2000, p. 102, (Mar. 24, 2000).

Pignolet et al., "Dependence of Ferroelectricity in Epitaxial Pulsed Laser Deposited Bismuth–Layered Perovskite Thin Films on the Crystallographic Orientation," ISIF 2000, p. 111, (Mar. 14, 2000).

Zurbuchen et al., "Morphology and Electrical Properties of Epitaxial SrBi2Nb2O9 Films," ISIF 2000, p. 51, (Mar. 13, 2000).

Saito et al., "Characterization of Residual Stress Free (001)– and (116)–oriented SrBi2Ta2O9 Thin Films Epitaxially Grown on (001) and (110) SrTiO3 Single Crystals," ISIF 2000, p. 71, (Mar. 13, 2000).

Pignolet et al., "Orientation dependence of ferroelectricity in pulsed–laser–deposited epitaxial bismuth–layered perovskite thin films," Applied Physics, Applied Physics A (Materials Science & Processing) (Germany), p. 283–291, (Feb. 23, 2000).

Moon et al., "Controlled growth of a–1b– and c–axis oriented epitaxial SrBi2Ta2O9 ferroelectric thin films," Applied Physics Letters, American Institute of Physics (Korea), vol. 75 (No. 18), p. 2827–2829, (Nov. 1, 1999).

Ishikawa et al., "Electrical properties of (001)– and (116)–oriented epitaxial SrBi2Ta2O9 thin films prepared by metalorganic chemical vapor deposition," Applied Physics Letters, American Institute of Physics (Japan), vol. 75 (No. 13), p. 1970–1972, (Sep. 27, 1999).

Alexe et al., "Patterning and switching of nanosize ferroelectric memory cells," Applied Physics Letters, American Institute of Physics (Germany), vol. 75 (No. 12), p. 1793–1795, (Sep. 20, 1999).

Alexei Gruverman, "Scaling effect on statistical behavior of switching parameters of ferroelectric capacitors," Applied Physics Letters, American Institute of Physics (Japan), vol. 75 (No. 10), p. 1452–1454, (Sep. 6, 1999).

Nagahama et al., "Epitaxy of (106)–oriented SrBi2Ta2O9 and SrBi2Nb2O9 thin films," Thin Solid Films, p. 52–55, (Jun. 2, 1999).

Shimakawa et al., "Crystal structures and ferroelectric properties of SrBi2Ta2O9 and Sr0.8Bi2.2Ta2O9," Applied Physics Letters, American Institute of Physics (Japan), vol. 74 (No. 13), p. 1904–1906, Feb. 1, 1999.

Lettieri et al., "Epitaxial growth of (001)–oriented and (110)–oriented SrBi2Ta2O9 thin films," Applied Physics Letters, American Institute of Physics (USA), vol. 73 (No. 20), p. 2923–2925, (Nov. 16, 1998).

Sanchez et al., "Epitaxial growth of SrTiO3 (00h), (0hh), and (hhh) thin films on buffered Si(001)," J. Mater. Res., Material Research Society (Spain), vol. 13, (No. 6), p. 1422–1425, (Jun. 1998).

Pignolet et al., "Epitaxial and Large Area PLD Ferroelectric Thin Film Heterostructures on Silicon Substrates," Integrated Ferroelectrics, Overseas Publishers Association (OPA), p. 485–498, (Jun. 4, 1998).

Eom et al., "Single Crystal Thin Films of Conductive Oxides SrRuO3 and Ferroelectric Heterostructures," Integrated Ferroelectrics, Overseas Publishers Association (OPA), p. 251–261, (Apr. 3, 1998).

Chen et al., "Epitaxial SrRuO3 thin films on (001) SrTiO3," Applied Physics Letters, American Institute of Physics (USA), vol. 71 (No. 8), p. 1047–1049, (Aug. 25, 1997).

Jia et al., "Deposition of epitaxial yttria–stabilized zirconia on single–crystal Si and subsequent growth of an amorphous SiO2 interlayer," Philosophical Magazine Letters, Center of Materials Science (USA), vol. 72 (No. 6), p. 385–391, (Jul. 12, 1995).

Eom et al., "Single–Crystal Epitaxial Thin Films of the Isotropic Metallic Oxides Sr1–xCaxRuO3 ($0<x<1$)," Science, p. 1766–1769, (Dec. 11, 1992).

Rae et al., "Structure Refinement of Commensurately Modulated Bismuth Strontium Tantalate, Bi2SrTa2O9," Acta Cryst., International Union of Crystallography (Australia), p. 418–428, (Feb. 4, 1992).

Ramesh et al., "Ferroelectric PbZr0.2Ti0.8O3 thin films on epitaxial Y—Ba—Cu—O," Applied Physics Letters, American Institute of Physics (USA), vol. 59, (No. 27), p. 3542–3544, (Dec. 30, 1991).

Ramesh et al., "Epitaxial Cuprate Superconductor/Ferroelectric Heterostructures," Science, p. 944–946, (Feb. 22, 2001).

Fork et al., "Epitaxial yttria–stabilized zirconia on hydrogen–terminated Si by pulsed laser deposition," Applied Physics Letters, American Institute of Physics (USA), vol. 57, (No. 11), p. 1137–1139, (Sep. 10, 1990).

Zakharov et al., "Substrate temperature dependence of structure and resistivity of SrRuO3 thin films grown by pulsed laser deposition on (100) SrTiO3," J. Mater. Res., Materials Research Society (USA), vol. 14 (No. 11), p. 4385–4394, (Nov. 4, 1999).

* cited by examiner

NON-C-AXIS ORIENTED BISMUTH-LAYERED PEROVSKITE FERROELECTRIC STRUCTURE EPITAXIALLY GROWN ON BUFFERED SILICON

TECHNICAL FIELD

The present application relates generally to the growth and structure of non-c-axis oriented ferroelectric materials. In particular, the present invention relates to anisotropic perovskite materials grown using a template layer formed on a buffered silicon substrate,

BACKGROUND ART

Ferroelectric perovskite materials are presently being studied as an alternative to conventional magnetic materials for use in digital memory systems. Accordingly, numerous investigations of polycrystalline, bismuth-containing layered (i.e., anisotropic) perovskite thin films, such as $SrBi_2Ta_2O_9$ (SBT) and $SrBi_2Nb_2O_9$ (SBN) thin films, have been stimulated by prospective technical applications in ferroelectric nonvolatile memories. This is due in large part to the high fatigue endurance of SBT and other layered perovskite materials. However, the application of such polycrystalline perovskite materials suffers from certain limitations. For instance, it is difficult to obtain ferroelectric properties that are homogeneous over the different cells of a large capacitor array when the lateral size of the ferroelectric cells drops below 100 nm (corresponding to cell sizes needed for Gigabit memories). Moreover, the existence of ferroelectric properties and their dependence on the cell size and material in such small structures (i.e., size effect) has been recently addressed in Alexe et al., "Patterning and switching of nanosize ferroelectric memory cells," *Appl. Phys. Lett.* 75, 1793 (1999); and J. F. Scott: Abstracts of $12^{th}$ International Symposium on Integrated Ferroelectrics ("Nano-Scale Ferroelectrics for Gbit Memory Application"), Aachen, Germany, Mar. 12–15, 2000, p. 102.

Successful efforts in the epitaxial growth of SBT thin films deposit pulsed laser deposition (PLD), metalorganic chemical vapor deposition (MOCVD), and RF magnetron sputtering methods, have been reported in Lettieri et al., "Epitaxial growth of (001)-oriented and (110)-oriented $SrBi_2Ta_2O_9$ thin films," *Appl. Phys. Lett.* 73, 2923 (1998); and Pignolet et al., "Orientation dependence of ferroelectricity in pulsed-laser-deposited epitaxial bismuth-layered perovskite thin films," *Appl. Phys.* A70, 283 (2000). In all of these works, special single crystalline substrates such as $SrTiO_3$, $LaAlO_3$—$Sr_2AlTaO_6$, $LaSrAlO_4$, and MgO of various orientations have been used to grow epitaxial c-axis-oriented as well as non-c axis oriented SBT thin films. It was generally found that c-axis-oriented epitaxial SBT films (i.e., films with their (001) plane parallel to the substrate surface) can be grown on $SrTiO_3$ (100) substrates, whereas epitaxial SBT films that have the (116) and (103) plane parallel to the substrate surface, grow on $SrTiO_3$(110) and (111) substrates, respectively. In Lettieri et al., "Epitaxial growth of non-c-oriented $SrBi_2Nb_2O_9$ on (111) $SrTiO_3$," *Appl. Phys. Lett.* 76, 2937 (2000), properly oriented ferroelectric films were epitaxially grown on $SrTiO_3$. Specifically, it was reported that heterostructures consisting of an underlying (111) $SrRuO_3$ epitaxial electrode and an epitaxial (103) $SrBi_2Nb_2O_9$ overlayer were prepared, as $SrRuO_3$ is closely lattice matched with $SrTiO_3$ and chemically compatible with both $SrBi_2Nb_2O_9$ and $SrTiO_3$.

The above observations are, however, not of high practical significance for memory devices, because $SrTiO_3$ crystals are not suitable substrates in microelectronics. For a better compatibility with silicon-based microelectronics, epitaxial SBT films should be grown on silicon substrates. The epitaxial growth of non-c-axis-oriented SBT on Si(100) has not heretofore been reported.

The growth of non-c-oriented bismuth-containing ferroelectric films having a layered perovskite structure, such as $SrBi_2Ta_2O_9$ (SBT), $SrBi_2Nb_2O_9$ (SBN) and $SrBi_3(Ta,Nb)_2O_9$ (SBTN), is of particular significance because the vector of the spontaneous electrical polarization in these layered perovskite materials is directed along the a-axis. By contrast, a c-oriented layered perovskite material does not have a polarization component along its film normal (perpendicular to the film plane). However, if the layered perovskite material is to be used in a ferroelectric thin-film capacitor with electrodes on the top and bottom film surfaces in the geometry used for dynamic random access memory, a normally oriented polarization component is essential. It would therefore be desirable to grow non-c-axis-oriented layered perovskite materials.

One example of a c-axis oriented silicon/metal oxide heterostructure that, for the purposes of the present invention, is not desirable, is disclosed in U.S. Pat. No. 5,270,298. Specifically, a buffer layer of yttria-stabilized zirconia is grown on a silicon substrate. A template of a c-axis oriented anisotropic perovskite material, such as bismuth titanate ($Bi_4Ti_3O_{12}$) is grown on the buffer layer. A cubic metal oxide such as a perovskite material of highly-oriented crystallinity is then able to be grown on the template layer. In the example provided in this patent, the metal oxide is $Pb_{1-y}La_yZr_{1-x}Ti_xO_3$ (PLZT), where $0<x<1$ and $0<y<1$.

Epitaxial $SrRuO_3$ thin films have been found useful as electrodes for ferroelectric capacitors, due to the high thermal and chemical stability of $SrRuO_3$ and because of its good lattice match with $SrTiO_3$ and $Pb(ZrTi)O_3$. $SrRuO_3$ is a pseudocubic perovskite with a slight orthorhombic distortion due to the tilting of the $RuO_6$ octahedra. High-quality epitaxial $SrRuO_3$ films have been successfully deposited on different substrates, such as $SrTiO_3$(100) and $LaAlO_3$(100) and by different methods like off-axis sputtering and PLD, as reported in Eom et al., "Single-Crystal Epitaxial Thin Films of the Isotropic Metallic Oxides $Sr_{1-x}Ca_xRuO_3$ ($0<x<1$)," *Science* 258, 1766 (1992); Chen et al., "Epitaxial $SrRuO_3$ thin films on (001) $SrTiO_3$," *Appl. Phys. Lett.* 71, 1047 (1997); and Zakharov et al., "Substrate temperature dependence of structure and resistivity of $SrRuO_3$ thin films grown by pulsed laser deporition on (100) $SrTiO_3$," *J. Mater. Res.* 14, 4385 (1999).

Recently, epitaxial (116)- and (103)-oriented SBT thin films grown on $SrRuO_3$ base electrodes deposited on lattice-matched perovskite $SrTiO_3$ substrates have been demonstrated by Ishikawa et al., "Electrical properties of (001)- and (116)-oriented epitaxial $SrBi_2Ta_2O_9$ thin films prepared by metalorganic chemical vapor deposition," *Appl. Phys. Lett.* 75, 1970 (1999); Zurbuchen et al.: Abstracts of $12^{th}$ International Symposium on Integrated Ferroelectrics ("Morphology and Electrical Properties of Epitaxial $SrBi_2Ta_2O_9$ Films"), Aachen, Germany, 12–15 Mar., 2000, p.51; Saito et al.: Abstracts of $12^{th}$ International Symposium on Integrated Ferroelectrics ("Characterization of Residual Stress Free (001)- and (116)-oriented $SrBi_2Ta_2O_9$ Thin Films Epitaxially Grown on (001) and (110) $SrTiO_3$ Single Crystals"), Aachen, Germany, 12–15 Mar., 2000, p.71; Pignolet et al., Abstracts of Integrated Ferroelectrics ("Dependence of Ferroelectricity in Epitaxial Pulsed Laser Deposited Bismuth-Layered Perovskite Thin Films on the Crystallographic Orientation"), Aachen, Germany, 12–15 Mar., 2000, p.111; and Lettieri et al., "Epitaxial growth of non-c-oriented $SrBi_2Nb_2O_9$ on (111) $SrTiO_3$," *Appl. Phys. Lett.* 76, 2937 (2000). However, as discussed above, these substrates are not suitable for use in the fabrication of integrated devices for microelectronic applications.

DISCLOSURE OF THE INVENTION

According to one embodiment of the present invention, a structure containing a ferroelectric material comprises a substrate comprising silicon, a buffer layer formed on the substrate, and a non-c-axis-oriented, electrically-conductive template layer formed on the buffer layer. The template layer comprises a perovskite oxide compound. A non-c-axis-oriented, anisotropic perovskite ferroelectric layer is formed on the template layer.

According to another embodiment of the present invention, a structure containing a ferroelectric material comprises a substrate comprising (100)-oriented silicon, a buffer layer comprising (100)-oriented, yttria-stabilized zirconia formed on the substrate, an electrically-conductive template layer formed on the buffer layer in which the template layer comprises a (110)-oriented perovskite oxide compound, and a (116)-oriented, layered perovskite ferroelectric film formed on the template layer.

According to yet another embodiment of the present invention, a structure containing a ferroelectric material comprises a substrate comprising (100)-oriented silicon, a buffer layer comprising (100)-oriented, yttria-stabilized zirconia formed on the substrate a buffer layer comprising (111)-oriented magnesium oxide formed on the yttria-stabilized zirconia, an electrically-conductive template layer formed on the buffer layer in which the template layer comprises a (111)-oriented perovskite oxide compound, and a (103)-oriented, layered perovskite ferroelectric film formed on the template layer.

According to still another embodiment of the present invention, an epitaxial, Aurivillius-phase metal oxide/ crystalline silicon heterostructure structure is provided in which the Aurivillius-phase metal oxide has a crystallographic c-axis. The structure comprises a crystalline silicon substrate having a (100) orientation, a buffer layer structure epitaxially oriented upon the crystalline silicon substrate, and an electrically conducting epitaxial template layer. The electrically conducting epitaxial template layer comprises an anisotropic perovskite that is formed epitaxially on the epitaxial buffer layer structure. The buffer layer structure causes the epitaxial template layer to be grown with a substantially non-c-axis orientation. The epitaxial, Aurivillius-phase metal oxide layer is formed upon the epitaxial template layer and has a substantially non-c axis orientation. The epitaxial, Aurivillius-phase metal oxide layer has an electrical polarization almost or exactly perpendicular to the crystallographic c-axis. The electrical polarization thus has a non-zero component perpendicular to the epitaxial, Aurivillius-phase metal oxide layer.

According to an additional aspect of the present invention, a method is provided for epitaxially growing a layer of a non-c-axis oriented ferroelectric material. In this method, a non-c-axis oriented, electrically conductive template layer comprising a perovskite oxide compound is formed on a zirconia-buffered, silicon-containing substrate. A non-c-axis oriented ferroelectric material is grown on the template layer.

It is therefore an object of the present invention to provide a structure, and a method for growing the same, that contains a non-c-axis oriented ferroelectric film, which structure exhibits properties useful in the development of data storage devices.

It is a further object of the present invention to provide a template on a buffered silicon substrate suitable for the growth of a non-c-axis oriented ferroelectric film.

Some of the objects of the invention having been stated hereinabove, other objects will become evident as the description proceeds when taken in connection with the accompanying drawings as best described hereinbelow.

BRIEF DESCRIPTION OF THE DRAWINGS

FIGS. 6a and 6b are X-ray diffraction scans of another exemplary structure provided according to the present invention;

DETAILED DESCRIPTION OF THE INVENTION

For purposes of the present disclosure, it will be understood that when a given component such as a layer, region or substrate is referred to herein as being disposed or formed "on" another component, that given component can be directly on the other component or, alternatively, intervening components (for example, one or more buffer layers, interlayers, electrodes or contacts) can also be present. It will be further understood that the terms "disposed on" and "formed on" are used interchangeably to describe how a given component is positioned or situated in relation to another component. Hence, the terms "disposed on" and "formed on" are not intended to introduce any limitations relating to particular methods of material transport, deposition, or fabrication.

As used herein, the abbreviation YSZ refers to yttria-stabilized zirconia ($ZrO_2$) or similarly stabilized zirconia.

As used herein, the abbreviation SBT refers to $SrBi_2Ta_2O_9$. Both of these terms are intended to also cover derivatives and slightly modified compositions of $SrBi_2Ta_2O_9$, with or without impurities such as dopants.

As used herein, the abbreviation SBN refers to $SrBi_2Nb_2O_9$. Both of these terms are intended to also cover derivatives and slightly modified compositions of $SrBi_2Nb_2O_9$, with or without impurities such as dopants.

As used herein, the abbreviation SBTN refers to $SrBi_2(Ta,Nb)_2O_9$. Both of these terms are intended to also cover derivatives and slightly modified compositions of $SrBi_2(Ta,Nb)_2O_9$, with or without impurities such as dopants.

The term "Aurivillius-type perovskites" or "Aurivillius-family perovskites" is to be construed interchangeably with the term "bismuth-layered perovskites" or "Bi-layered perovskites."

Terms relating to crystallographic orientations, such as Miller indices and angles in relation to the plane of a layer of material, are intended to cover not only the exact value specified (e.g., (116), 45° and so on) but also any small deviations from such exact value that might be observed.

Figure 1:
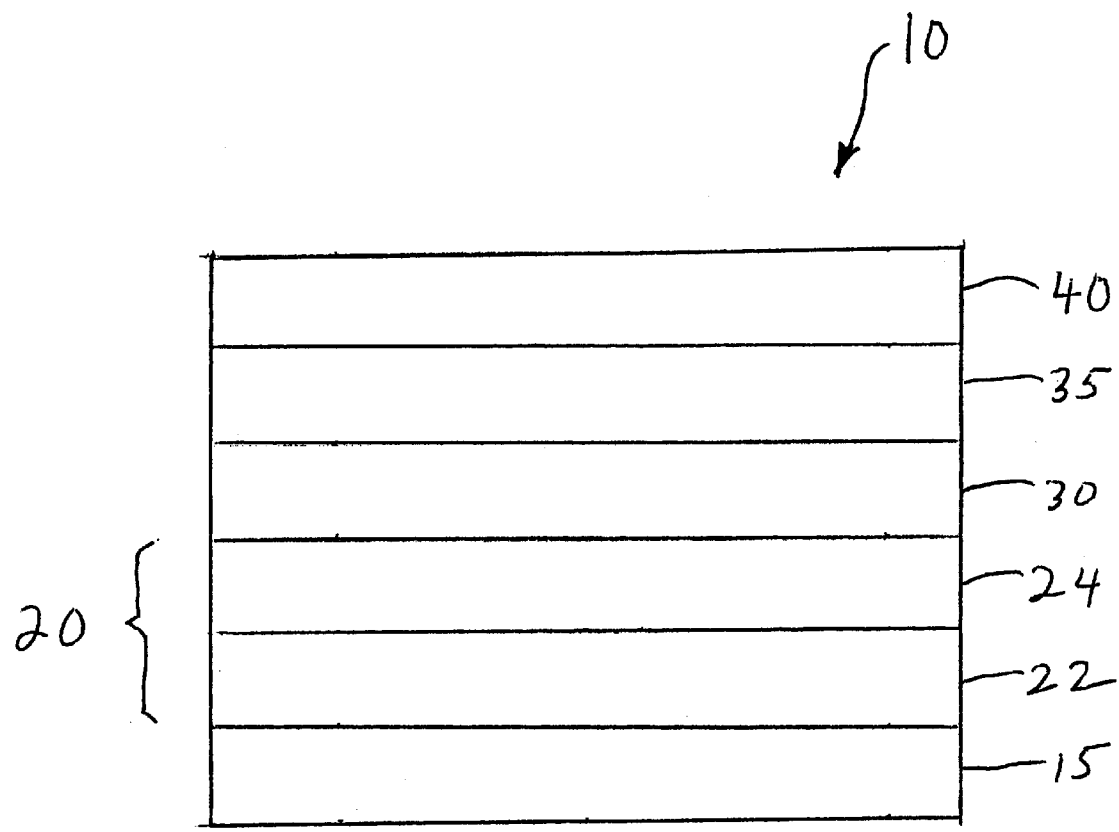
FIG. 1 is a simplified cross-sectional view of the basic layers of a structure provided according to the present invention.

Referring now to FIG. 1, there is illustrated a heterostructure, generally designated 10, that contains a non-c-axis-oriented, bismuth-layered perovskite ferroelectric film epitaxially grown on buffered silicon. Accordingly, heterostructure 10 comprises a wafer or substrate 15 of silicon, which has a (100) orientation and is covered with a (100)-oriented buffer layer 20. A template layer 30 comprising a non-c-axis-oriented, electrically conductive, oxide-containing material is deposited on buffer layer 20. In accordance with the present invention, the composition and structure of template layer 30 are such that template layer 30 provides a template suitable for enabling the epitaxial growth of a layer of non-c-axis-oriented, anisotropic ferroelectric material 35 preferably exhibiting a bismuth-containing perovskite structure. Preferably, template layer 30 is a cubic or pseudo-cubic perovskite metal oxide. Non-limiting examples of suitable template layers 30 include strontium ruthenate ($SrRuO_3$) and lanthanum nickelate ($LaNiO_3$). For the purpose of fabricating a device that benefits from the use and properties of ferroelectric layer 35, an electrically conductive layer 40 such as an electrode or a contact can be disposed on ferroelectric layer 35. Template layer 30 can thus serve as a bottom electrode for ferroelectric layer 35. Various deposition methods understood by persons skilled in the art can be employed in forming the several layers described herein, and the present invention is not limited to the use of any particular deposition or material transport technique.

In a first specific embodiment according to the present invention, buffer layer 20 comprises zirconia ($ZrO_2$) that is stabilized with a suitable substance such as yttria. Thus, buffer layer 20 preferably comprises (100)-oriented yttria-stabilized zirconia (YSZ) deposited on substrate 15. The use of the (100)-oriented YSZ as buffer layer 20 enables the growth of template layer 30 comprising (110)-oriented perovskite materials such as $SrRuO_3$ and $LaNiO_3$. Ferroelectric layer 35 having a (116) orientation can then be successfully epitaxially grown on (110)-oriented template layer 30. Non-limiting examples of suitable non-c-axis-oriented, anisotropic ferroelectric materials 35 include SBT ($SrBi_2Ta_2O_9$), SBN ($SrBi_2Nb_2O_9$), and SBTN ($SrBi_2(Ta,Nb)_2O_9$).

In a second specific embodiment according to the present invention, ferroelectric layer 35 is a non-c-oriented epitaxial film comprising bismuth titanate ($Bi_4Ti_3O_{12}$), which can be doped with lanthanum (La) and has a (118) orientation. Accordingly, referring to FIG. 1 and the first specific embodiment just described, the bismuth titanate or lanthanum-substituted bismuth titanate is substituted for the SBT, SBN, or SBTN.

Regarding the ferroelectric films specified for the first and second embodiments, Miller indices—e.g., (116) and (118)—have been used to describe very specific, exact crystallographic orientations. According to the present invention, however, the orientations of the ferroelectric films can be generalized by considering the angle that the c-axis of ferroelectric layer 35 forms with the plane of substrate 15. The Miller indices, on the other hand, describe very exact values of the angle from the substrate plane. The (118) orientation given for bismuth titanate corresponds to the (116) orientation given for SBT, SBN, or SBTN. The difference in the respective Miller indices results from the fact that bismuth titanate has a different lattice parameter c than that of SBT, SBN, or SBTN. Moreover, other equivalent Aurivillius phases, now known or subsequently developed, may have different lattice parameters and hence different Miller indices. Therefore, the materials having (116) and (118) orientations can be generalized within the scope of the present disclosure by stating that the c-axis of ferroelectric layer 35 is tilted approximately 45° plus or minus a small deviation or tolerance (e.g.,±3°) from the substrate plane. The tolerance in the angle accounts for the belief that exact angles might not actually be observed in nature for a given material, but rather a small deviation in the value for the angle might occur due to crystallographic reasons. It therefore will be understood that the use herein of orientation-related or angular terms such as (116) or 45° is intended to cover not only the exact value given but also small deviations therefrom.

In a third specific embodiment according to the present invention, buffer layer 20 comprises more than one component layer. Referring again to FIG. 1, a first component layer 22 comprises the (100)-oriented YSZ. A second component layer 24, preferably comprising (111)-oriented MgO and/or TiN, is grown on YSZ-containing first component layer 22. The use of such (111)-oriented films deposited on the YSZ (100)/Si (100) system enables the growth of template layer 30 comprising (111)-oriented perovskite materials such as $SrRuO_3$ and $LaNiO_3$. Ferroelectric layer 35 having a (103) orientation can then be successfully epitaxially grown on (111)-oriented template layer 30. As in previously described embodiments, non-limiting examples of suitable non-c-axis-oriented, anisotropic ferroelectric materials 35 include SBT ($SrBi_2Ta_2O_9$), SBN ($SrBi_2Nb_2O_9$), and SBTN ($SrBi_2(Ta,Nb)_2O_9$).

In a fourth specific embodiment according to the present invention, ferroelectric layer 35 is a non-c-oriented epitaxial film comprising bismuth titanate ($Bi_4Ti_3O_{12}$), which can be doped with lanthanum (La) and has a (104) orientation. Accordingly, referring to FIG. 1 and the third specific embodiment just described, the bismuth titanate or lanthanum-substituted bismuth titanate is substituted for the SBT, SBN, or SBTN. As analogously indicated hereinabove with respect to the first and second specific embodiments, the orientations of the ferroelectric films of the third and fourth embodiments can be generalized by considering the angle that the c-axis of ferroelectric layer 35 forms with the plane of substrate 15. The (104) orientation given for bismuth titanate corresponds to the (103) orientation given for SBT, SBN, or SBTN. The materials having (103) and (104) orientations can therefore be generalized within the scope of the present disclosure by stating that the c-axis of ferroelectric layer 35 is tilted approximately 55° plus or minus a small deviation or tolerance (e.g., ±30°) from the substrate plane.

It will be understood that other non-c-oriented epitaxial films comprising other Aurivillius-type materials may be grown on the silicon substrate structures in accordance with the present invention.

Heterostructure 10 provided in accordance with any of the embodiments described hereinabove can be used in a ferroelectric thin-film capacitor or other device for random access memory (RAM) applications, such as dynamic random access memory (DRAM). As one example, a ferroelectric capacitor is provided in which ferroelectric layer 35 is sandwiched between conductive layer 40, such as a metal or conductive oxide electrode, and template layer 30 serving as a bottom electrode.

EXAMPLE 1

A PLD technique was employed to deposit SBT and $SrRuO_3$ thin films as well as YSZ using a PLD setup similar to that described previously in Pignolet et al., "Orientation dependence of ferroelectricity in pulsed-laser-deposited epitaxial bismuth-layered perovskite thin films," *Appl. Phys.* A70, 283 (2000); and Pignolet et al., "Epitaxial and Large Area PLD Ferroelectric Thin Film Heterostructures on Silicon Substrates," *Integr. Ferroelectr.* 21, 485 (1998). Briefly, a KrF excimer laser ($\lambda$=248 nm), operating at a repetition rate of 5 Hz with an energy density of 2–4 $J/cm^2$, was used to deposit SBT thin films onto $SrRuO_3$/YSZ/Si(100). The base pressure in the chamber was $5 \times 10^{-8}$ mbar before raising the substrate temperature. Wafers of p-Si(100) with a resistivity of 1–5Ωcm were used as substrates. An epitaxial YSZ thin film 75 nm thick was first grown on the Si(100) substrate at a substrate temperature of 800° C. with a flowing $O_2$ pressure of $1.7 \times 10^{-3}$ mbar. Details on the epitaxial growth of YSZ on Si have been described previously in Fork et al., "Epitaxial yttria-stabilized zirconia on hydrogen-terminated Si by pulsed laser deposition," *Appl. Phys. Lett.* 57,1137 (1990); and Jia et al., "Deposition of epitaxial yttria-stabilized zirconia on single-crystal Si and subsequent growth of an amorphous $SiO_2$ interlayer," *Philos. Mag. Lett.* 72, 385 (1995). The $SrRuO_3$ film with a thickness of 100 nm was deposited at 775° C. in 0.14 mbar of $O_2$ pressure using a laser energy density of 1.7 $J/cm^2$. Finally 150nm thick SBT thin films were grown with the substrate temperature and oxygen chamber pressure fixed at 740° C. and 0.2 mbar, respectively. All layers were deposited in the same chamber by changing the targets without breaking the vacuum. After the SBT film deposition, the samples were cooled to room temperature in 0.4 mbar of oxygen to prevent bismuth loss in the SBT film. Detailed deposition conditions are summarized in Table 1 here in below. Crystallographic orientations and epitaxial relations were characterized by X-ray diffraction (XRD) θ-2θ scans and pole figure measurements using a Philips X'PERT MRD™ 4-circle diffractometer. Cu $K_\alpha$ radiation and a parallel plate collimator in front of the detector with 2θ resolution of 0.1° were used. The pole figures were measured using an open Eulerian cradle.

TABLE 1

Growth Conditions for SBT, $SrRuO_3$, and YSZ Thin Films by PLD

| | SBT | $SrRuO_3$ | YSZ |
|---|---|---|---|
| Target | $SrBi_{2.6}Ta_2O_9$ | $SrRuO_3$ | $ZrO_2$ + 10 mol % $Y_2O_3$ |
| Substrate temperature (° C.) | 740 | 775 | 800 |
| Oxygen pressure (mbar) | 0.20 | 0.14 | $0.17 \times 10^{-2}$ |
| Laser pulse energy density ($J/cm^2$) | 3.4 | 1.7 | 1.7 |

Figure 2:
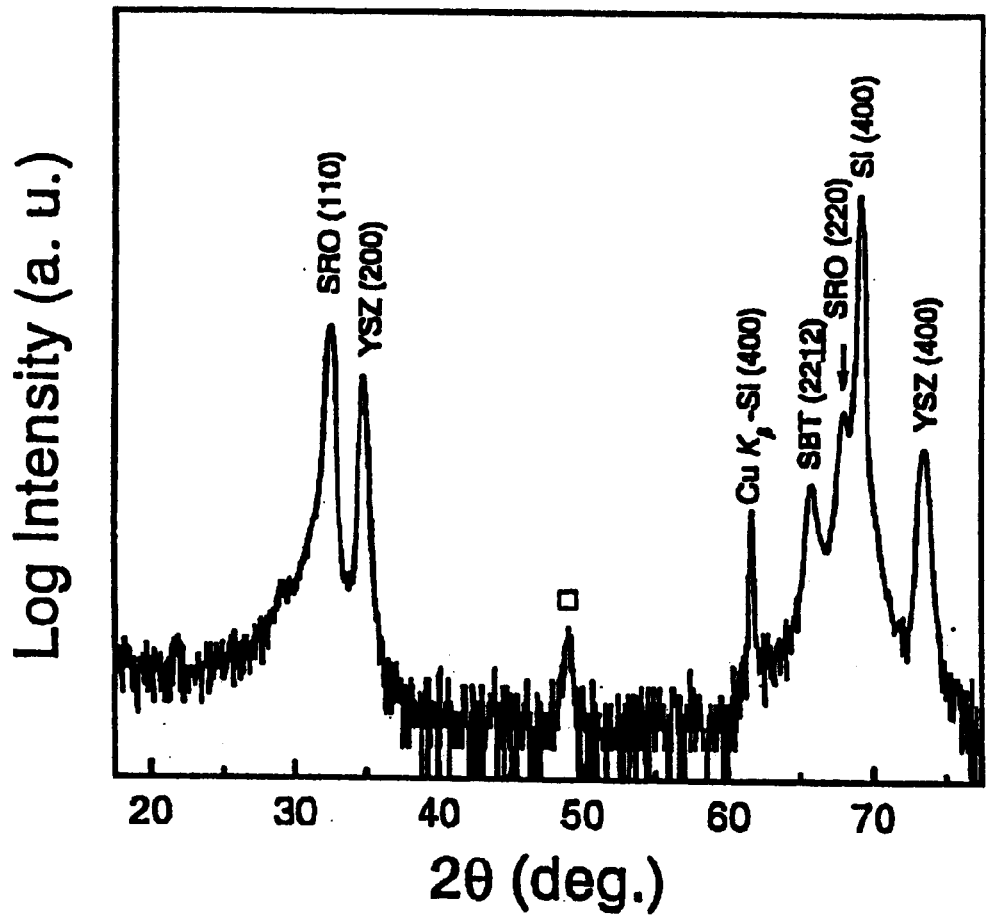
FIG. 2 is an X-ray diffraction pattern of an exemplary structure provided according to the present invention.
Figure 3:
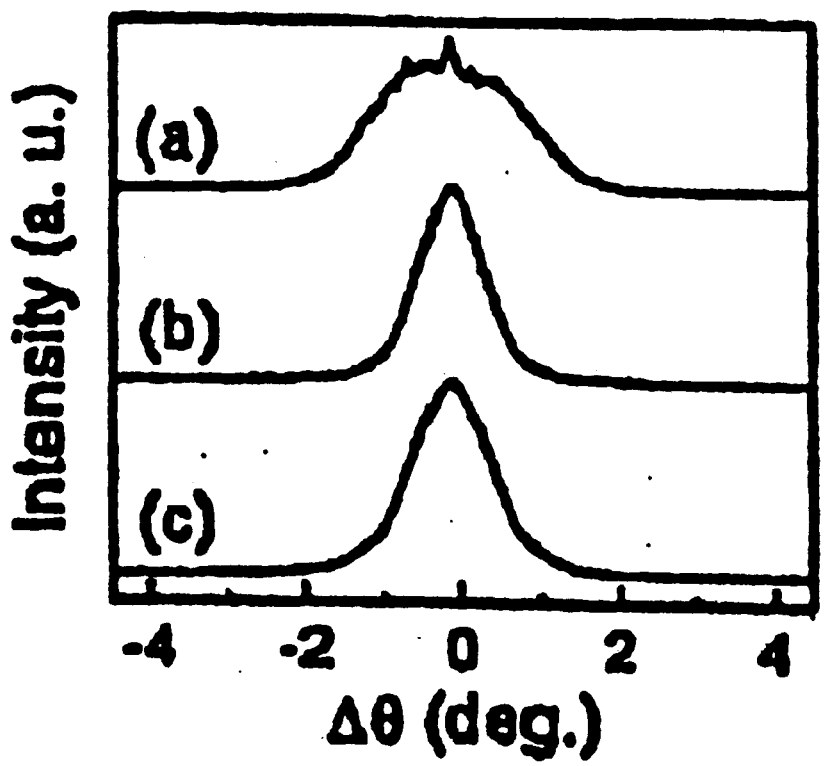
FIG. 3 illustrates rocking curve scans for various layers of the structure in FIG. 2.

Referring to the diffraction pattern on FIG. 2, the result of XRD θ-2θ scan of a SBT/$SrRuO_3$/YSZ/Si structure is illustrated. FIG. 2 represents well-defined (116)-oriented SBT, (110)-oriented $SrRuO_3$, and (100)-oriented YSZ films. All of the Miller indices for the $SrRuO_3$ layer referred to in this example are based on the pseudo-cubic lattice parameter $a_c$=0.393 nm. For SBT, an orthorhombic unit cell was assumed: a=0.5531 nm, b=0.5534 nm, and c=2.498 nm. The epitaxial relationship between the thin films and substrate, based on the XRD θ-2θ result, is SBT(116)∥$SrRuO_3$(110) ∥YSZ(100)∥Si(100). Referring to the rocking curve θ-scan of FIG. 3, the full-width at half maximum (FWHM) values of the SBT(22$\underline{12}$), $SrRuO_3$(110), and YSZ(200) peaks are 1.7°, 0.96°, and 1.07°, respectively. These rocking curve θ-scans suggest that YSZ is a good template layer for $SrRuO_3$ growth. One can also see an unidentified peak, labeled as (□) in FIG. 2, with low diffraction intensity of about 4% of that of the SBT(22$\underline{12}$) at 2θ=49.050°. This unidentified peak belongs to a well-oriented plane, because the peak has a FWHM of Δθ=2.2° in the rocking curve measurement.

Figure 4:
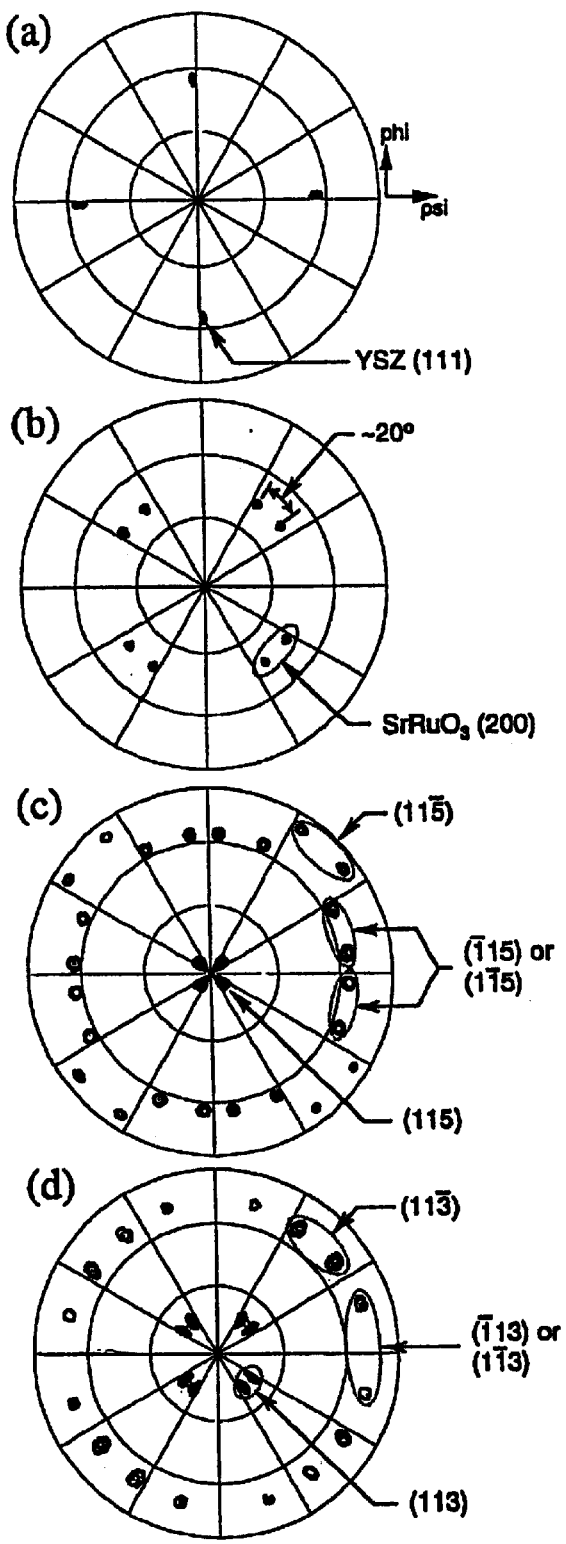
FIGS. 4a–4d are X-ray pole figures for various layers of the structure in FIG. 2.

Various pole figure analyses were conducted to confirm the crystallographic orientation and to determine whether the SBT/$SrRuO_3$YSZ heterostructure is epitaxial. Referring to FIG. 4, X-ray pole figures of the SBT, $SrRuO_3$, and YSZ thin films are illustrated. The fixed 2θ angles used to record the pole figures in FIG. 4 are 30.080°, 46.180°, 28.97°, and 25.13°, corresponding to the YSZ{111} (FIG. 4a), $SrRuO_3${200} (FIG. 4b), SBT{115} (FIG. 4c), and (FIG. 4d) planes, respectively. The pole figures were plotted with the pole distance angle ψ= °(center) to ψ=90°(rim). In the case of SBT{113} in FIG. 4a, four diffraction peaks with a four-fold symmetry are observed as ψ=54.7°, showing that the YSZ(100) thin film has a very good in-plane orientation. The values of the tilt distribution of the YSZ(200) reflection and of the in-plane twist misalignment of the YSZ(111) reflections, measured by θ-rocking curve and φ-scan, were 1.07° and 1.13°, respectively. The resolution in Φ-scan as measured on the Si(111) was 0.21°.

Figure 5:
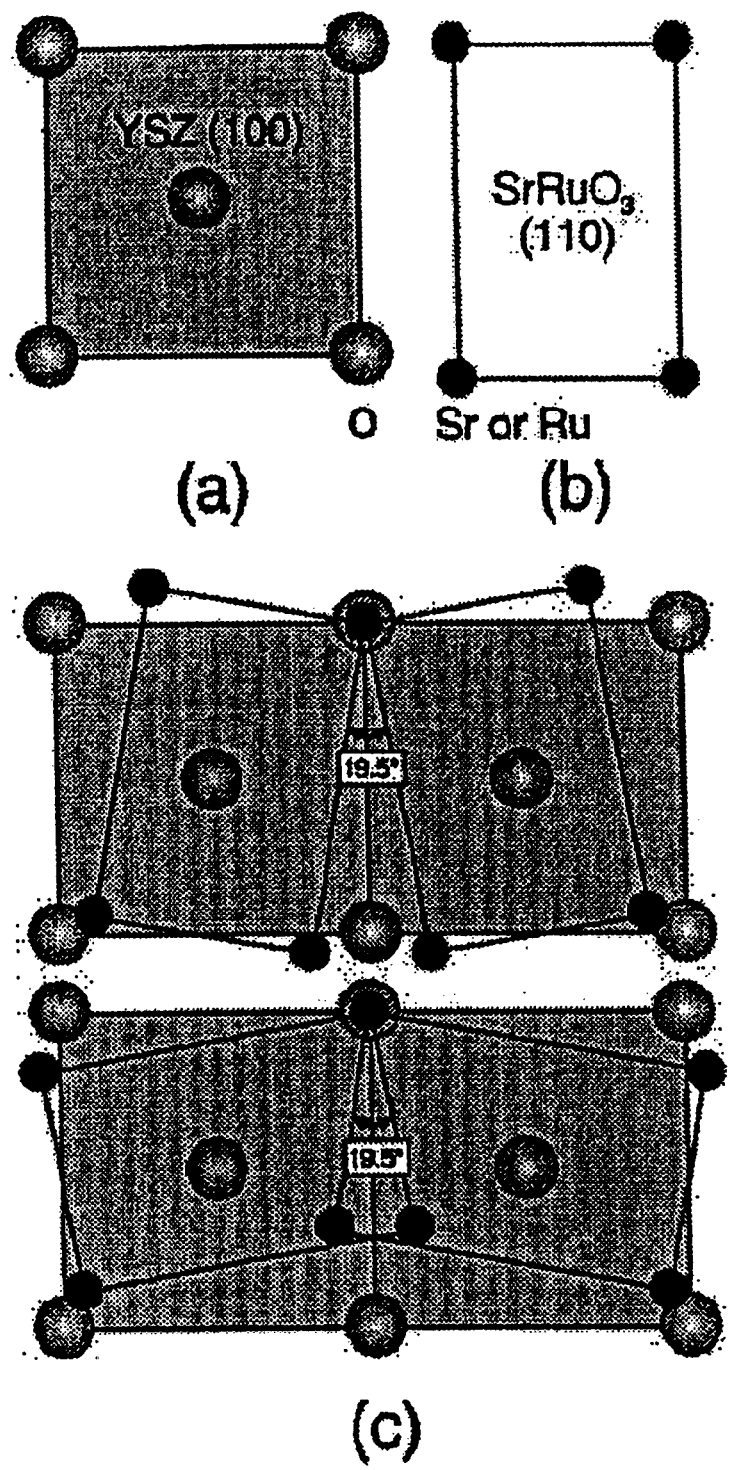
FIGS. 5a–5c are schematic diagrams illustrating the structures and pitaxial relationships of two of the layers of the structure in FIG. 2.

An apparent degeneracy with a four-fold symmetry (four-fold epitaxial positioning) of the $SrRuO_3$ thin film can be seen at ψ=45° in the pole figure of FIG. 4b. Each set shows two symmetric diffraction peaks with an offset Δφ of approximately 20°. The separation of the reflection peaks in the pole figure of FIG. 4b provides direct evidence for the specific in-plane-epitaxial growth pattern of $SrRuO_3$ on YSZ illustrated in FIG. 5. Domains of each of the four azimuthal orientation variants of the (110)-oriented $SrRuO_3$ in FIG. 5 are present in the $SrRuO_3$ thin film. These orientation variants result in the degeneracy of the pole figure (FIG. 4b), with the characteristic separation angle of 19.5°. This angle results from the azimuthal angle of 9.75° between the $SrRuO_3$[001] and YSZ[010] directions, as indicated in FIG. 5. From this schematic diagram and the X-ray diffraction results, the epitaxial orientation relationship of the $SrRuO_3$ thin film on YSZ/Si(100) can be described as $SrRuO_3$(110) ∥YSZ(100)∥Si(100) and $SrRuO_3$[111]∥YSZ[110]∥Si[110] taking into account that the $SrRuO_3$[111] direction may be parallel to any of the four YSZ directions [110], [$\bar{1}$10], [1$\bar{1}$0], and [$\bar{1}\bar{1}$0]. However, despite the high intensity of the $SrRuO_3$ (110) diffraction peak in the θ-2θ scan of FIG. 2, relatively broad peaks with a FWHM of 2.94° were found in the θ-scan, which is comparably higher than that of the YSZ (111) with a value of 1.13°. Such a relatively broad distribution originates from the large lattice mismatch of −6.3% between the interplanar spacings of $SrRuO_3$(111) and YSZ (110). A similar growth trend of $SrRuO_3$(110) thin films on YSZ(100)/Si(100) substrates had been observed before, for example, in Hou et al., "Structure and properties of epitaxial $Ba_{0.5}Sr_{0.5}TiO_3$/$SrRuO_3$/$ZrO_2$ heterostructure on Si grown by off-axis sputtering," *Appl. Phys. Lett.* 67, 1387 (1995).

In order to analyze the in-plane orientation of the SBT thin film, two pole figure measurements were performed at 2θ=28.97° and 2θ=25.13° for the SBT{115} and {113} planes, respectively (FIGS. 4c and 4d). In FIG. 4c, the innermost four peaks centered at ψ=5.2° originate from the SBT(115) plane, which is the plane of the strongest diffraction intensity. From this pole figure, it is concluded that the SBT(116) plane is parallel to the substrate surface, because the angle between the (116) and (115) planes of SBT is 5.16°. Moreover, the diffraction peaks from ($\bar{1}$15) or (1$\bar{1}$5), and (11$\bar{5}$) are also present in FIG. 4c at ψ=65.1° and ψ=81.3°. Although a pole figure of {115} peaks is sufficient to identify the orientation, the sample was further examined by taking one more pole figure of SBT{113} to unambiguously confirm the epitaxial orientation as shown in FIG. 4d. In this figure, one can clearly observe the peaks from (113), (11$\bar{3}$), and ($\bar{1}$13) or (1$\bar{1}$3) at ψ=18.1°, 68.4°, and 73.1°, respectively. As expected from both the pole figure in FIG. 4b and the schematic drawing of a rectangle-on-cube epitaxy of $SrRuO_3$ in FIG. 5, all SBT peaks have a four-fold degeneracy having two symmetric peaks with an offset, Δφ, of approximately 20°. By referring to the pole figures, the epitaxial relationship between SBT and $SrRuO_3$ can be given as SBT(116)‖$SrRuO_3$(110); SBT[110]‖$SrRuO_3$[001] (orthorhombic indexing of SBT). A similar epitaxial relationship between SBT(106) and the titanate $SrTiO_3$(110) has been reported as SBT[010]‖$SrTiO_3$[001] (tetragonal indexing of SBT) in Nagahama et al., "Epitaxy of (106)-oriented $SrBi_2Ta_2O_9$ and $SrBi_2Nb_2O_9$ thin films," Thin Solid Films 353, 52 (1999). In this latter publication, however, the authors used a tetragonal indexing of SBT with a≈b≈0.39 nm.

In addition, ferroelectric hysteresis loops of the (116)-oriented SBT films on $SrRuO_3$ bottom electrodes on YSZ-buffered Si(100) have been recorded, giving a remanent polarization $P_r$=3.4 μC/cm$^2$ and a coercive filed $E_c$=71kV/cm at a maximum applied electric field of 283 kV/cm.

It can therefore be seen from the description of the foregoing example that non-c-oriented epitaxial SBT thin films have been grown on Si substrates with $SrRuO_3$ and YSZ buffer layers. A rectangle-on-cube type of epitaxy between $SrRuO_3$ and YSZ revealed that $SrRuO_3$ and YSZ are good template layers including a bottom electrode for the growth of (116)-oriented SBT thin films on Si(100) substrates. The epitaxial relationship determined by X-ray diffraction is SBT(116)‖$SrRuO_3$(110)‖YSZ(100)‖Si(100); SBT[110]‖$SrRuO_3$[001] and $SrRuO_3$[111]‖YSZ<110>‖Si<110<.

As indicated hereinabove, anisotropic properties of bismuth-layered perovskites such as SBT and SBN have been studied by means of epitaxial thin films having different crystallographic orientations grown on single crystalline substrates such as $SrTiO_3$ (STO), $LaSrAlO_4$, and MgO. SBT or SBN thin films having (001), (116), and (103) orientations have been grown, for example, on (001)-, (011)-, and (111)-oriented STO substrates, respectively, revealing that the three-dimensional epitaxial relationship SBT(001)‖STO(001); SBT[110]‖STO[100] is valid for all cases of SBT thin films on STO substrates, irrespective of their orientations. The (103)-oriented SBT films showed higher remanent polarization and dielectric constant than the (116)-oriented SBT films, since epitaxial (116)- and (103)-oriented SBT films have the direction of their spontaneous polarization lying 31° and 56° away from the film plane, respectively. Therefore, the (103)-oriented SBT (or SBN) films have a larger vertical polarization component normal to the film plane than the (116)-oriented SBT (or SBN) film. On the other hand, the c-axis-oriented SBT film revealed no ferroelectricity along the [001] axis. The reason for this electrical anisotropy is that the vector of the spontaneous polarization in SBT is directed perpendicularly to the c axis, specifically along the a axis. Although SBT films with (116) and (103) orientations on STO have been reported, these are still far from practical significance for memory devices, because those complex oxide crystals are not suitable as substrates in microelectronics. For a better compatibility with silicon-based microelectronics, epitaxial SBT films should be grown on silicon substrates. The ability to grow non-c-axis-oriented SBT films with a (116) orientation on Si(100) substrates has been demonstrated hereinabove.

In order to further increase the vertical component of the vector of the spontaneous polarization in SBT films, the epitaxial growth of (103)-oriented SBT films on buffered Si(100) substrates was investigated. Exemplary results of such films deposited by pulsed laser deposition (PLD) are given hereinbelow.

EXAMPLE 2

All films of SBT, $SrRuO_3$(SRO), MgO, and yttria-stabilized $ZrO_2$(YSZ) were deposited in situ by PLD, employing a KrF excimer laser (λ=248 nm) operating at a repetition rate of 5 Hz with an energy density of 2–4 J/cm$^2$. The base pressure in the chamber was 5×10$^{-8}$ mbar before raising the substrate temperature. p-Si(100) substrates were silver pasted on a stainless steel substrate holder, which was placed parallel to the target at a distance of 6 cm. The target was rotated at about 0.2 Hz during the deposition. The substrate temperature was measured with a K-type thermocouple positioned in the middle of the substrate holder. The epitaxial 50 nm-thick YSZ, 25 nm-thick MgO, 50 nm-thick SRO, and 250 nm-thick SBT thin films were deposited on Si(100) substrates at substrate temperatures of 800° C. (YSZ and MgO), 775° C. (SRO), and 740° C. (SBT) in flowing $O_2$ pressures of 1.7×10$^{-3}$ mbar (YSZ and MgO), 0.14 mbar (SRO), and 0.4 mbar (SBT), respectively. For the electrical characterization, Pt top electrodes with an area of 1.1×10$^{-3}$ cm$^2$ were deposited by rf-sputtering at room temperature. After top electrode deposition, the samples were annealed at 450° C. for 30 min in an oxygen atmosphere to stabilize the contact between SBT and Pt. The heterostructures were structurally characterized by x-ray diffraction (XRD) θ-2θ and φ scans using a Philips X'PERT MRD™ four-circle diffractometer. The polarization versus electric field (P-E) hysteresis loops of (103)-oriented SBT films were recorded by a TF ANALYZER 2000™ ferroelectric tester (AixACCT) at 100 Hz.

Figures 6, 6A:
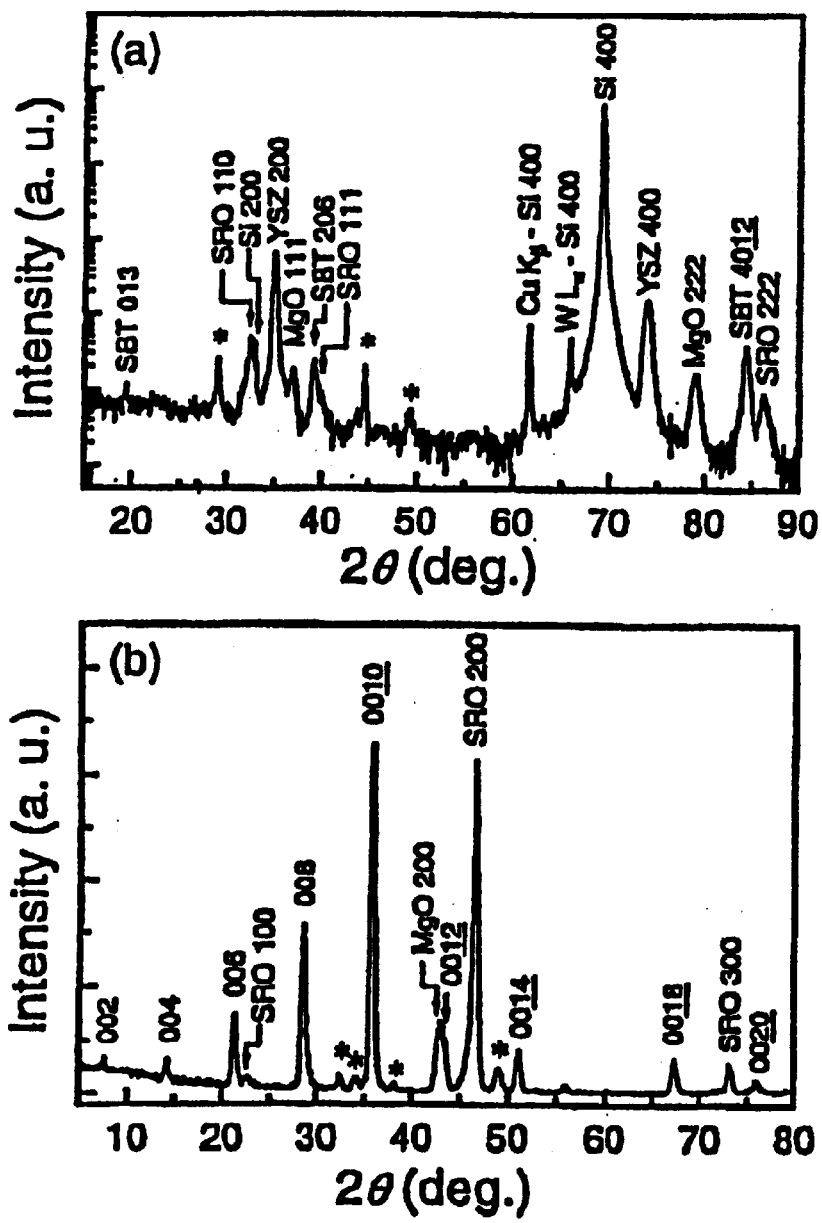

FIG. 6a shows the result of an XRD θ-2θ scan of a SBT/SRO/MgO/YSZ/Si(100) structure. The figure displays x-ray spectra for (103)-oriented SBT, (111)-oriented SRO, (111)-oriented MgO, and (100)-oriented YSZ films, although there is a small contribution of SRO(110) domains and of impurity phases labeled as (*), most probably other Sr-Bi-Ta-O compounds, for instance pyrochlore- or fluorite-like phases. All the Miller indices for SBT and SRO referred to in this example are based on orthorhombic (a=0.5531 nm, b=0.5534 nm, and c=2.4984 nm) SBT and pseudocubic ($a_c$=0.3928 nm) SRO lattice parameters, respectively. The orientation relationship between the thin films and the substrate, based on the XRD θ-2θ result, is SBT(103)‖SRO(111)‖MgO(111)‖YSZ(100)‖Si(100). The full width at half maximum values of rocking curves of the SBT 40$\underline{12}$, SRO 111, MgO 111, and YSZ 200 reflections are 2.2°, 1.9°, 1.5°, and 1.1°, respectively.

Another XRD θ-2θ scan optimized for the SBT 0010 reflection, taken at ψ=55.1°, revealed well-defined SBT (103) and SRO(111) orientations as shown in FIG. 6b (ψ=90° corresponds to the substrate surface being parallel to the plane defined by the incident and reflected x-ray beams).

SBT 00l and SRO h00 peaks are clearly seen revealing that SBT(001)∥SRO(100), which means that SBT(103)∥SRO (111), because the calculated tilt angles between the corresponding two planes of SBT and SRO are ∠SBT(103):SBT (001)=56.4° and ∠SRO(111):SRO(100)=54.7°, respectively (the ψ angle used to record the θ-2θ scan was 55.1°). The unidentified peaks labeled as (*) might be related with the impurity phases mentioned earlier.

Figure 7:
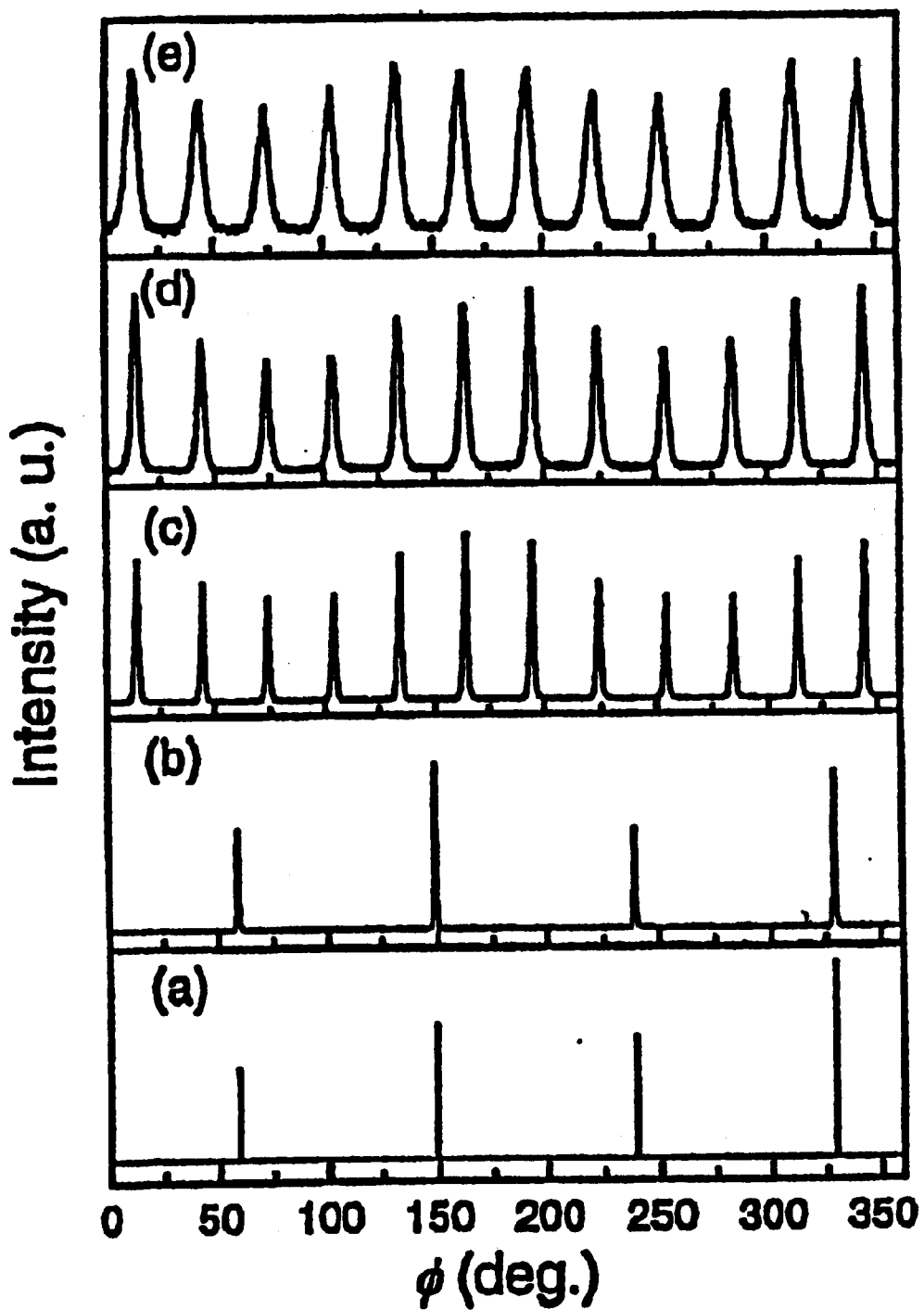
FIG. 7 illustrates diffraction scans through different layers of the structure in FIGS. 6a and 6b.

In order to determine whether the SBT/SRO/MgO/YSZ/Si heterostructure is epitaxial and to confirm the crystallographic orientation, various φ scans were conducted. FIG. 7 shows φ scans of (a) Si 111, (b) YSZ 111, (c) MgO 200, (d) SRO 200, and (e) SBT 113 reflections. The reflections were recorded at fixed ψ angles of 39.8° for the SBT film and 54.7° for the other films. As discussed hereinabove, a YSZ(100) film shows a four-fold growth symmetry on Si(100) substrates revealing a cube-on-cube epitaxy relationship as shown in FIGS. 7a and 7b.

Figure 8:
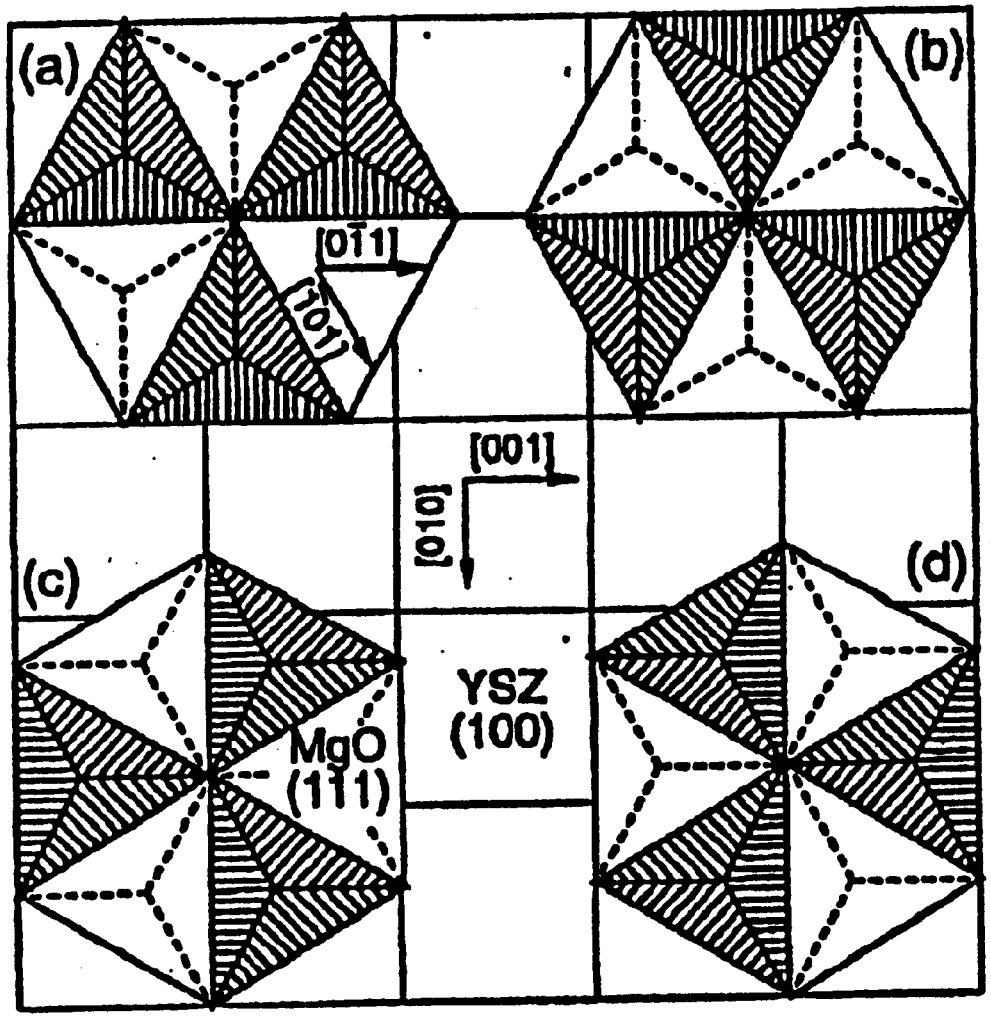
FIGS. 8a–8d are schematic diagrams illustrating cystallographic relationships in the structure in FIGS. 6a and 6b rotated in-plane by 0°, 90°, –90°, and 180° around the normal to substrate surface, respectively.

The epitaxial orientation relationship between the MgO film and the YSZ film does not follow the MgO(100)∥YSZ (100) relationship nor the MgO(110)∥YSZ(100) relationship, although the latter had been reported before. In a φ scan of the MgO 200 reflection (FIG. 7c), twelve peaks were recorded. These peaks correspond to a three-fold symmetry with four different positions of MgO(111) domains on the YSZ(100) film. The twelve symmetric peaks in the φ scan of FIG. 7c provide reliable evidence for the specific in-plane-epitaxial growth pattern of the MgO(111) film on the YSZ(100) film illustrated in FIG. 8. In FIG. 8, four types of azimuthally rotated domains (rotated in-plane by 0°, 90°, −90°, and 180° around the schematically sketched. The four orientation variants result in the twelve φ scan peaks FIG. 7c, with a characteristic separation angle of 30° between the neighboring peaks. From these XRD results and the schematic drawing, the epitaxial orientation relationship between MgO(111) and YSZ(100) films is determined as MgO(111)∥YSZ(100); MgO[0$\bar{1}$1]∥YSZ (001), taking into account that the MgO[011] direction may be parallel to any of the four YSZ directions [010], [0$\bar{1}$1], [001], and [00$\bar{1}$]. The misfit value $(d_{film}-d_{sub})/d_{sub}$ along the MgO[$\bar{2}$11]∥YSZ[010] direction was calculated from $d_{film}$=d($\bar{2}$11)MgO and $d_{sub}$=d(010)YSZ as approximately 0.4%. That along the MgO[0$\bar{1}$1]∥YSZ[001] directi amounts to approximately 15.9%. A similar growth trend of MgO(111) thin films on YSZ(100)/Si(100) substrates has been observed before. See, e.g., P. A. Stampe and R. J. Kennedy, "X-ray characterization of MgO thin films grown by laser ablation on yttria-stabilized zirconia," *Journal of Crystal Growth*, 191, 472 (1998). From the φ scan of the SRO 200 reflection at ψ=45° shown in FIG. 7d, an epitaxial growth was revealed for the SRO(111) film on the MgO(111) film, with the corresponding epitaxial relationship SRO(111)∥MgO (111); SRO[0$\bar{1}$1]MgO[0$\bar{1}$1]. The SRO film also consists of four azimuthal domains, which are directly "replicated" from the four azimuthal domains of the MgO film. The lattice misfit along the [001]SRO∥[001]MgO direction is about −6.7%. In FIG. 7d, there is a small contribution originating from a shoulder of the SBT 206 peak, since the fixed angles of 2θ=46.18° and ψ=54.7° to record the φ scan using the SRO 200 reflection are close to the angles 2θ and ψ of the SBT 110 reflection in the (103)-oriented SBT film, at ψ=53.9°.

A triple-domain positioning of the SBT film on each of the four azimuthal domains of the SRO film was revealed for the (103)-oriented SBT film on the SRO/MgO/NYSZ/Si heterostructure, as shown in FIG. 7e. The (103)-oriented SBT film growing on these four azimuthal domains of the (111)-oriented SRO film turns out to consist of twelve corresponding azimuthal domains (or multiple twins). The epitaxial relationships between the films and the substrate, based on all the XRD results, are SBT(103)∥SRO(111)∥MgO (111)∥YSZ(100)∥Si(100); SBT[010]∥SRO[0$\bar{1}$1]MgO[0$\bar{1}$1]∥YSZ {001}∥Si {001}.

Figure 9:
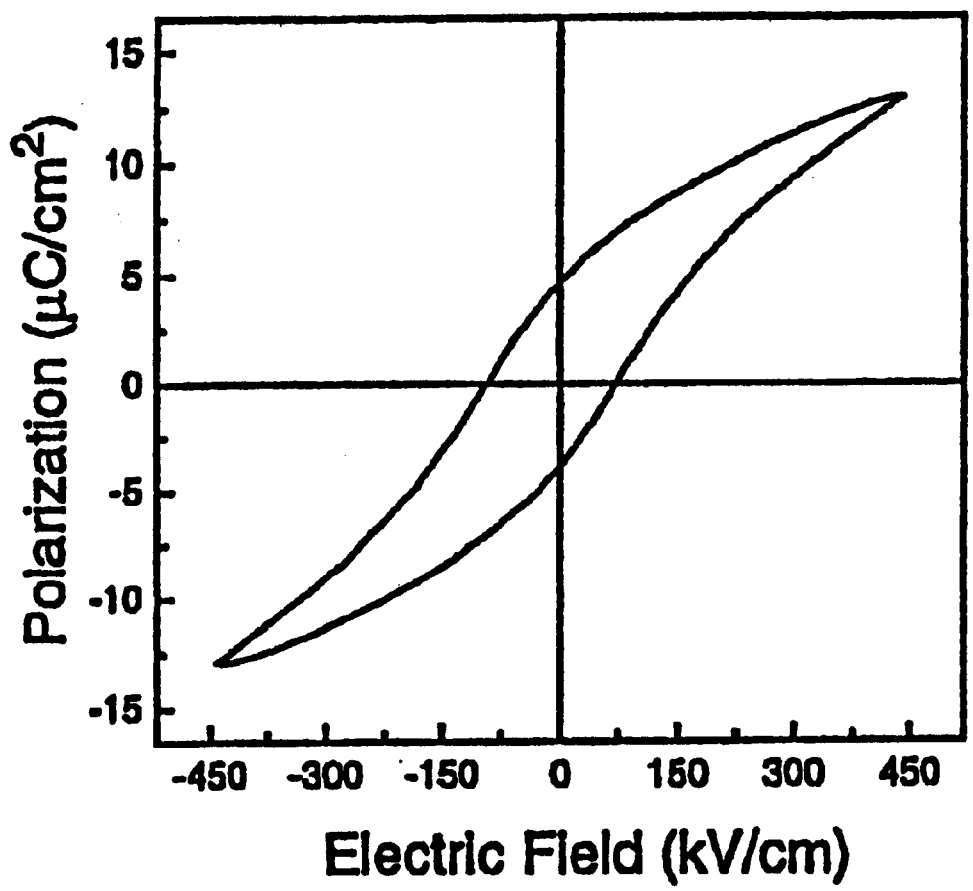
FIG. 9 is a ferroelectric hysteresis loop describing behavior of the structure in FIGS. 6a and 6b.

FIG. 9 shows a ferroelectric hysteresis loop revealing a remanent polarization ($P_r$) of 5.2 $\mu C/cm^2$ and a coercive field ($E_c$) of 76 kV/cm for a maximum applied electric field of 440 kV/cm. By comparing the $P_r$ value with that of a (116)-oriented SBT film on a buffered Si(100) substrate ($P_r$<4$\mu C/cm^2$), it is concluded that the growth of non-c-axis-oriented SBT films, which have the direction of the spontaneous polarization closer to the film normal, is advantageous for the application of these films as a capacitor material to planar-type ferroelectric random access memories. However, the overall value of $P_r$ is lower than the reported values for SBT films grown epitaxially on STO substrates as well as for SBN films on STO. This might be a result of a worse crystallinity (presence of impurity phases) and/or the presence of multiple twins in the SBT films on buffered-Si substrates.

It therefore can be seen from the foregoing description that the present invention provides a template suitable for promoting the growth of non-c-axis oriented ferroelectric films. The resulting heterostructure is useful in digital memory applications, such as ferroelectric capacitors, as well as for further investigation into the properties of ferroelectric materials.

What is claimed is:

1. A structure containing a ferroelectric material, the structure comprising:
   (a) a substrate comprising silicon;
   (b) a buffer layer formed on the substrate;
   (c) a non-c-axis-oriented, electrically-conductive template layer formed on the buffer layer, the template layer comprising a perovskite oxide compound; and
   (d) a non-c-axis-oriented, anisotropic perovskite ferroelectric layer formed on the template layer.

2. The structure according to claim 1 wherein the silicon of the substrate has a (100) orientation.

3. The structure according to claim 2 wherein the buffer layer comprises (100)-oriented yttria-stabilized zirconia.

4. The structure according to claim 3 wherein the buffer layer comprises a first component and a second component formed on the first component, the first component comprises the yttria-stabilized zirconia, and the second component comprises magnesium oxide.

5. The structure according to claim 4 wherein the second component further comprises titanium nitride.

6. The structure according to claim 4 wherein the second component has a (111) orientation.

7. The structure according to claim 6 wherein the perovskite oxide compound of the template layer has a (111) orientation in a pseudo-cubic indexing.

8. The structure according to claim 7 wherein the perovskite oxide compound comprises strontium ruthenate.

9. The structure according to claim 7 wherein the perovskite oxide compound comprises lanthanum nickelate.

10. The structure according to claim 7 wherein the substrate has a plane, the ferroelectric layer has a c-axis, and the c-axis of the ferroelectric layer is tilted approximately 55°±3° from the substrate plane.

11. The structure according to claim 10 wherein the ferroelectric layer comprises $Bi_4Ti_3O_{12}$.

12. The structure according to claim 11 wherein the ferroelectric layer comprises lanthanum-substituted bismuth titanate.

13. The structure according to claim 7 wherein the ferroelectric layer has a (104) orientation.

14. The structure according to claim 7 wherein the ferroelectric layer has a (103) orientation.

15. The structure according to claim 14 wherein the ferroelectric layer comprises a bismuth-containing perovskite compound.

16. The structure according to claim 15 wherein the ferroelectric layer comprises $SrBi_2Ta_2O_9$.

17. The structure according to claim 15 wherein the ferroelectric layer comprises $SrBi_2Nb_2O_9$.

18. The structure according to claim 15 wherein the ferroelectric layer comprises $SrBi_2(Ta,Nb)_2O_9$.

19. The structure according to claim 3 wherein the buffer layer comprises a first component and a second component formed on the first component, the first component comprises the yttria-stabilized zirconia, and the second component comprises titanium nitride.

20. The structure according to claim 3 wherein the perovskite oxide compound of the template layer has a (110) orientation.

21. The structure according to claim 20 wherein the perovskite oxide compound of the template layer comprises strontium ruthenate.

22. The structure according to claim 20 wherein the perovskite oxide compound of the template layer comprises lanthanum nickelate.

23. The structure according to claim 20 wherein the substrate has a plane, the ferroelectric layer has a c-axis, and the c-axis of the ferroelectric layer is tilted approximately 45°±3° from the substrate plane.

24. The structure according to claim 23 wherein the ferroelectric layer comprises $Bi_4Ti_3O_{12}$.

25. The structure according to claim 24 wherein the ferroelectric layer comprises lanthanum-substituted bismuth titanate.

26. The structure according to claim 20 wherein the ferroelectric layer has a (118) orientation.

27. The structure according to claim 20 wherein the ferroelectric layer has a (116) orientation.

28. The structure according to claim 27 wherein the ferroelectric layer comprises $SrBi_2Ta_2O_9$.

29. The structure according to claim 27 wherein the ferroelectric layer comprises $SrBi_2Nb_2O_9$.

30. The structure according to claim 27 wherein the ferroelectric layer comprises $SrBi_2(Ta,Nb)_2O_9$.

31. The structure according to claim 1 wherein the buffer layer comprises yttria-stabilized zirconia.

32. The structure according to claim 1 wherein the perovskite oxide compound of the template layer comprises strontium ruthenate.

33. The structure according to claim 1 wherein the perovskite oxide compound of the template layer comprises lanthanum nickelate.

34. The structure according to claim 1 wherein the perovskite oxide compound of the template layer has a substantially cubic crystal structure.

35. The structure according to claim 1 wherein the perovskite oxide compound of the template layer has a substantially pseudo-cubic crystal structure.

36. The structure according to claim 1 wherein the ferroelectric layer comprises a perovskite compound selected from the Aurivillius family.

37. The structure according to claim 1 wherein the ferroelectric layer comprises a perovskite compound having a (116) orientation.

38. The structure according to claim 1 wherein the ferroelectric layer comprises a perovskite compound having a (118) orientation.

39. The structure according to claim 1 wherein the ferroelectric layer comprises a perovskite compound having a (103) orientation.

40. The structure according to claim 1 wherein the ferroelectric layer comprises a perovskite compound having a (104) orientation.

41. The structure according to claim 1 comprising an electrode formed on the ferroelectric layer.

42. A structure containing a ferroelectric material, the structure comprising:
   (a) a substrate comprising (100)-oriented silicon;
   (b) a buffer layer comprising (100)-oriented, yttria-stabilized zirconia formed on the substrate;
   (c) an electrically-conductive template layer formed on the buffer layer, the template layer comprising a (110)-oriented perovskite oxide compound; and
   (d) a (116)-oriented, layered perovskite ferroelectric film formed on the template layer.

43. A structure containing a ferroelectric material, the structure comprising:
   (a) a substrate comprising (100)-oriented silicon;
   (b) a first buffer layer comprising (100)-oriented, yttria-stabilized zirconia formed on the substrate;
   (c) a second buffer layer comprising (111)-oriented magnesium oxide formed on the first buffer layer;
   (d) an electrically-conductive template layer formed on the buffer layer, the template layer comprising a (111)-oriented perovskite oxide compound; and
   (e) a (103)-oriented, layered perovskite ferroelectric film formed on the template layer.

44. A method for epitaxially growing a layer of a non-c-axis oriented ferroelectric material, comprising the steps of:
   (a) forming a non-c-axis oriented, electrically conductive template layer comprising a perovskite oxide compound on a zirconia-buffered, silicon-containing substrate;
   (b) growing a non-c-axis oriented ferroelectric material on the template layer.

45. The method according to claim 44 comprising the step of forming the buffer layer by growing an oxide compound on a layer of yttria-stabilized zirconia.

46. The method according to claim 44 comprising the step of forming the buffer layer by growing a nitride compound on a layer of yttria-stabilized zirconia.

47. An epitaxial, Aurivillius-phase metal oxide/crystalline silicon heterostructure structure, said Aurivillius-phase metal oxide having a crystallographic c-axis, said structure comprising,
   a crystalline silicon substrate, said crystalline silicon substrate having a (100) orientation; a buffer layer structure epitaxially oriented upon said crystalline silicon substrate; and an electrically conducting epitaxial template layer,
said electrically conducting epitaxial template layer comprising an anisotropic perovskite, formed epitaxially on said epitaxial buffer layer structure, said buffer layer structure causing said epitaxial template layer to be grown with a substantially non-c-axis orientation and said epitaxial, Aurivillius-phase metal oxide layer formed upon said epitaxial template layer having a substantially non-c axis orientation, whereby said epitaxial, Aurivillius-phase metal oxide layer has an electrical polarization almost or exactly perpendicular to said crystallographic c-axis, said electrical polarization thus having a non-zero component perpendicular to said epitaxial, Aurivillius-phase metal oxide layer.

48. The epitaxial, Aurivillius-phase metal oxide/crystalline silicon heterostructure structure according to claim 47, wherein said buffer layer consists substantially of (100) oriented stabilized zirconia.

49. The epitaxial, Aurivillius-phase metal oxide/crystalline silicon heterostructure structure according to claim 47, wherein said buffer layer consists substantially of (100) oriented yttrium stabilized zirconia in combination with a subsequently grown second layer portion, said subsequently grown second layer portion having at least one component selected from a list of components, said list of components comprising TiN and MgO.

50. The epitaxial, Aurivillius-phase metal oxide/crystalline silicon heterostructure structure according to claim 47, wherein said Aurivillius phase is a bismuth-containing ferroelectric material having a layered perovskite structure.

51. The epitaxial, Aurivillius-phase metal oxide/crystalline silicon heterostructure structure according to claim 47, wherein said Aurivillius phase is selected from the group consisting of $SrBi_2Ta_2O_9$, $SrBi_2Nb_2O_9$, and $SrBi_2(Ta,Nb)_2O_9$, or of these materials with a slightly modified composition.

52. The epitaxial, Aurivillius-phase metal oxide/crystalline silicon heterostructure structure according to claim 48, wherein said template layer consists of strontium ruthenate, said strontium ruthenate having a (110) orientation and said Aurivillius-phase metal oxide having a (116) orientation.

53. The epitaxial, Aurivillius-phase metal oxide/crystalline silicon heterostructure structure according to claim 48, wherein said template layer consists of lanthanum nickelate, said lanthanum nickelate having a (110) orientation and said Aurivillius-phase metal oxide having a (116) orientation.

54. The epitaxial, Aurivillius-phase metal oxide/crystalline silicon heterostructure structure according to claim 49, wherein said subsequently grown second layer portion has a (111) orientation.

55. The epitaxial, Aurivillius-phase metal oxide/crystalline silicon heterostructure structure according to claim 50, wherein said template layer consists of strontium ruthenate, said strontium ruthenate having a (111) orientation and said Aurivillius-phase metal oxide having a (103) orientation.

56. The epitaxial, Aurivillius-phase metal oxide/crystalline silicon heterostructure structure according to claim 50, wherein said template layer consists of lanthanum nickelate, said lanthanum nickelate having a (111) orientation and said Aurivillius-phase metal oxide having a (103) orientation.

57. An epitaxial, Aurivillius-phase metal oxide/crystalline silicon heterostructure structure, said Aurivillius-phase metal oxide having a crystallographic c-axis, said structure comprising, a crystalline silicon substrate, said crystalline silicon substrate having a (100) orientation; a buffer layer structure epitaxially oriented upon said crystalline silicon substrate; and an electrically conducting epitaxial template layer, and an electrically conducting contact layer.

said electrically conducting epitaxial template layer comprising an anisotropic perovskite, formed epitaxially on said epitaxial buffer layer structure, said buffer layer structure causing said epitaxial template layer to be grown with a substantially non-c-axis orientation and said epitaxial, Aurivillius-phase metal oxide layer formed upon said epitaxial template layer having a substantially non-c axis orientation, whereby said epitaxial, Aurivillius-phase metal oxide layer has an electrical polarization almost or exactly perpendicular to said crystallographic c-axis, said electrical polarization thus having a non-zero component perpendicular to said epitaxial, Aurivillius-phase metal oxide layer.

58. The epitaxial, Aurivillius-phase metal oxide/crystalline silicon heterostructure structure according to claim 57, wherein said buffer layer consists substantially of (100) oriented stabilized zirconia.

59. The epitaxial, Aurivillius-phase metal oxide/crystalline silicon heterostructure structure according to claim 57, wherein said buffer layer consists substantially of (100) oriented stabilized zirconia in combination with a subsequently grown second layer portion, said subsequently grown second layer portion having at least one component selected from a list of components, said list of components comprising TiN and MgO.

60. The epitaxial, Aurivillius-phase metal oxide/crystalline silicon heterostructure structure according to claim 57, wherein said Aurivillius phase is a bismuth-containing ferroelectric material having a layered perovskite structure.

61. The epitaxial, Aurivillius-phase metal oxide/crystalline silicon heterostructure structure according to claim 57, wherein said Aurivillius phase is selected from the group consisting of $SrBi_2Ta_2O_9$, $SrBi_2Nb_2O_9$, and $SrBi_2(Ta,Nb)_2O_9$, or of these materials with a slightly modified composition.

62. The epitaxial, Aurivillius-phase metal oxide/crystalline silicon heterostructure structure according to claim 58, wherein said template layer consists of strontium ruthenate, said strontium ruthenate having a (110) orientation and said Aurivillius-phase metal oxide having a (116) orientation.

63. The epitaxial, Aurivillius-phase metal oxide/crystalline silicon heterostructure structure according to claim 58, wherein said template layer consists of lanthanum nickelate, said lanthanum nickelate having a (110) orientation and said Aurivillius-phase metal oxide having a (116) orientation.

64. The epitaxial, Aurivillius-phase metal oxide/crystalline silicon heterostructure structure according to claim 59, wherein said subsequently grown second layer portion has a (111) orientation.

65. The epitaxial, Aurivillius-phase metal oxide/crystalline silicon heterostructure structure according to claim 60, wherein said template layer consists of strontium ruthenate, said strontium ruthenate having a (111) orientation and said Aurivillius-phase metal oxide having a (103) orientation.

66. The epitaxial, Aurivillius-phase metal oxide/crystalline silicon heterostructure structure according to claim 60, wherein said template layer consists of lanthanum nickelate, said lanthanum nickelate having a (111) orientation and said Aurivillius-phase metal oxide having a (103) orientation.

* * * * *